United States Patent
Huang et al.

(10) Patent No.: US 7,335,324 B2
(45) Date of Patent: Feb. 26, 2008

(54) COLOR FILTER MANUFACTURING METHOD FOR A PLASTIC SUBSTRATE

(75) Inventors: Liang-Ying Huang, Hsinchu (TW); Ching-Hsiang Chan, Hsinchu (TW); Jia-Chong Ho, Hsinchu (TW); Chi-Chang Liao, Hsinchu (TW); Lung-Pin Hsin, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 472 days.

(21) Appl. No.: 10/679,348

(22) Filed: Oct. 7, 2003

(65) Prior Publication Data

US 2005/0046068 A1  Mar. 3, 2005

(30) Foreign Application Priority Data

Aug. 28, 2003  (TW) ............... 92123828 A

(51) Int. Cl.
  B29C 59/00  (2006.01)
  B29C 70/30  (2006.01)
(52) U.S. Cl. .............. 264/129; 264/246
(58) Field of Classification Search ............ None
  See application file for complete search history.

(56) References Cited

U.S. PATENT DOCUMENTS

| | | | | |
|---|---|---|---|---|
| 5,399,390 | A | * | 3/1995 | Akins ............... 428/1.62 |
| 5,712,065 | A | * | 1/1998 | Chiang ............... 430/7 |
| 5,995,191 | A | * | 11/1999 | Tamai et al. ............ 349/156 |
| 6,077,560 | A | * | 6/2000 | Moshrefzadeh et al. .... 427/108 |
| 6,383,694 | B1 | * | 5/2002 | Wu et al. ............ 430/7 |
| 6,801,274 | B2 | * | 10/2004 | Suzuki ............ 349/106 |
| 6,870,585 | B2 | * | 3/2005 | Chen et al. ............ 349/106 |
| 2004/0004691 | A1 | * | 1/2004 | Nakahara et al. ........ 349/158 |
| 2004/0096595 | A1 | * | 5/2004 | Otagiri et al. ............ 428/1.31 |

* cited by examiner

*Primary Examiner*—Edmund H. Lee
(74) *Attorney, Agent, or Firm*—Quintero Law Office

(57) ABSTRACT

A color filter manufacturing method for a plastic substrate uses an extrusion process to form a plastic substrate with multiple grooves. Then, it uses inkjet printing method to jet photo resists into the groove of the plastic substrate after defining the primary colors of red R., green G., and blue B. The method can overcome the problem happened in the conventional CF photolithography process. This, therefore, can simplify the manufacturing process, and can apply to the large-area plastic substrate of a color filter.

7 Claims, 8 Drawing Sheets

COLOR FILTER MANUFACTURING METHOD FOR A PLASTIC SUBSTRATE

BACKGROUND OF THE INVENTION

1. Field of the Invention

The present invention relates to a color filter manufacturing method for a plastic substrate. More particularly, it uses an inkjet printing method to jet photo resists into the groove of the plastic substrate.

2. Description of the Prior Art

Liquid crystal displays have the advantages of small volume, light weight, low power consumption, low radiation, excellent image quality, broad applications, and are widely applied in the consumer electronic products or computer products, such as medium to small portable TVs, mobile phones, camcorders, notebook computers, desktop computers and projection TVs, etc. More particularly, the main stream of LCD is using in flat panel display system. The key component for presenting better brightness, vividness, and color-ness in liquid crystal displays is in the color filter. Therefore, the color filter has a full potential in the LCD development. The biggest market of the color filter is in notebook industry. More particularly, it focuses on the color filter with big-area, low pollution, and low cost characters. The main stream of the conventional color filter manufacture is to implement the lithography process. It mainly comprises three steps: One is coating for three primary colors of R, G, and B color filtering layers. Another step is proximity alignment exposure. The other step is development. Among the steps, the development of the color filtering layer coating technique is paid for more attention, such on the rotational coating method. However, the shortage of the conventionally rotational coating method has a low usage in materials, which is about 1 to 2%. More, it also needs more CF processes thereto cause more wearing damages and increase more contacting chances with chemical liquids.

Another coating technique is provided by Dai Nippon Printing DNP. The color filter is manufactured by inkjet printing method applying on the glass substrate. The method overcomes the low rate of using materials while using the rotational coating method. However, it needs to do bank between the color filtering layers for against color mixing in color filtering layers, and the bank needs to be formed while doing CF process. Further, the used chemical liquids in the process easily cause damage on the substrate. More, color filtering layer is directly printing on the surface of the substrate thereto the surface tension is less than the cohesive force. It, therefore, has a worse coating character.

SUMMARY OF THE INVENTION

In order to overcome the shortages of the current color filter manufacturing method, the present invention is to provide a color filter manufacturing method for a plastic substrate. More particularly, the method is applied to the plastic substrate. The plastic substrate potentially stand less chemical corrosion than the glass substrate, and therefore, the conventional CF process of manufacturing color filters needs to be processed in many times with chemical liquids. Apart from above, it causes damages on the plastic substrate thereto influence the quality of the color filter. As a result, it needs to choose the chemical liquid of which is with less corrosion character to do CF process while using the plastic substrate to manufacture a color filter. However, the manufacturing cost is increased herein. The present invention for overcoming the problem is therefore, to provide a technique applying to the plastic substrate without processing many CF processes to implement a color filter. The method uses a re-molding technique to form a plastic substrate with multiple grooves. Then, it uses the inkjet printing method to jet three primary colors into the grooves of the above saying substrate.

Further, it processes coating on the plane layer. The feature of the process is that the substrate is one-piece to be formed thereto implement a big-area filter. Also, it does not need to use CF process thereto avoid any damages from using chemical liquids and decrease environmental pollution. Another method is that the color filtering layer jetted into the groove, and therefore, solves the coating problem caused from the surface tension by the inkjet printing method. The present invention can fully implement the purpose of manufacturing color filter based on achieving a simple manufacture and a low cost.

BRIEF DESCRIPTION OF THE DRAWINGS

FIG. 2a is an example of the present invention showing a substrate by using a master mold in FIG. 1 to do extrusion;

FIG. 2b is a 3-D graph showing the substrate formed from FIG. 2a;

DETAILED DESCRIPTION OF THE PREFERRED EMBODIMENTS

Figure 1:
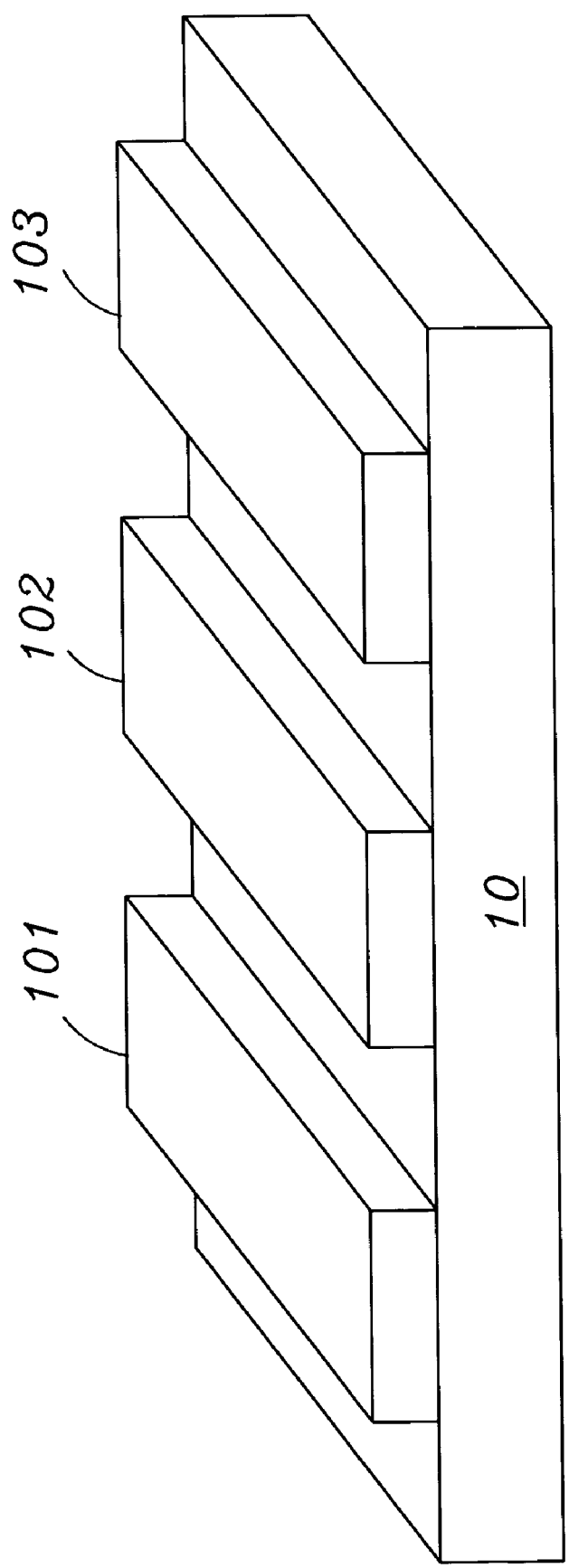
FIG. 1 is a 3-D graph of the present invention showing a master mold.

One of the color filter manufacturing methods for a plastic substrate according to the present invention uses a re-molding technique to form the plastic substrate. The master mold of the re-molding plastic substrate uses etching and electriolating techniques of LIGA LithographieGaVanoformung Abformung to implement. The LIGA technique defines the required graphs by the micro-development. Then, it processes the steps of electro-deposition, electro-forming, and electriolating to perform the etching. Finally, it processes a micro molding and a micro-injection molding to form the master mold 10 in at least three-bump areas 101, 102, and 103 as shown in FIG. 1.

Figure 2:
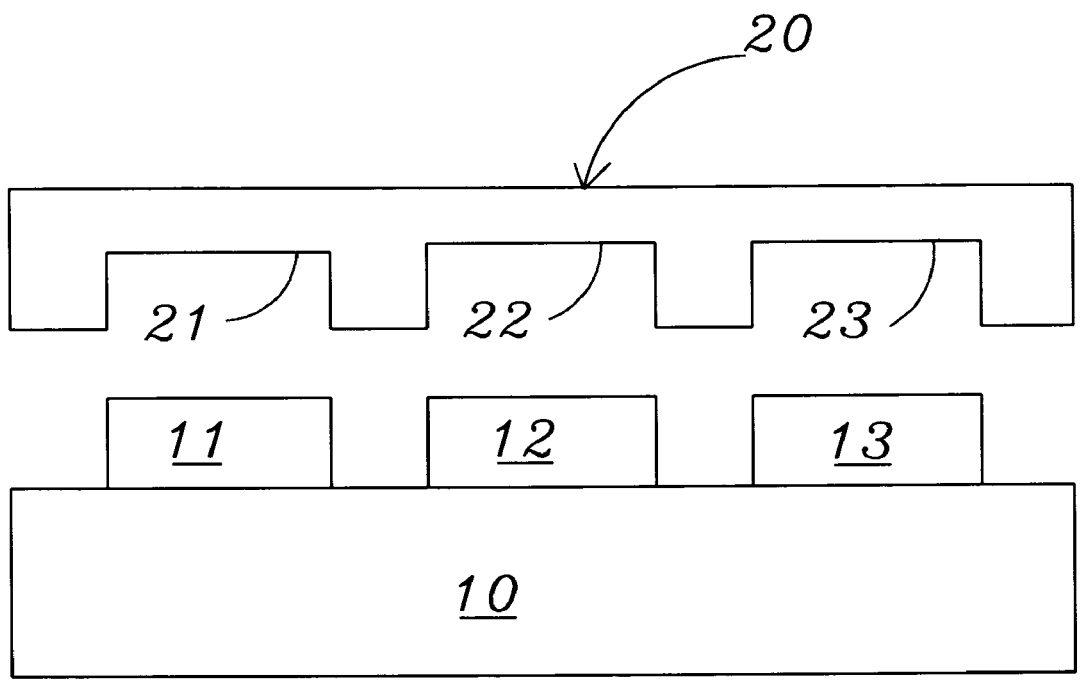
Figure 2:
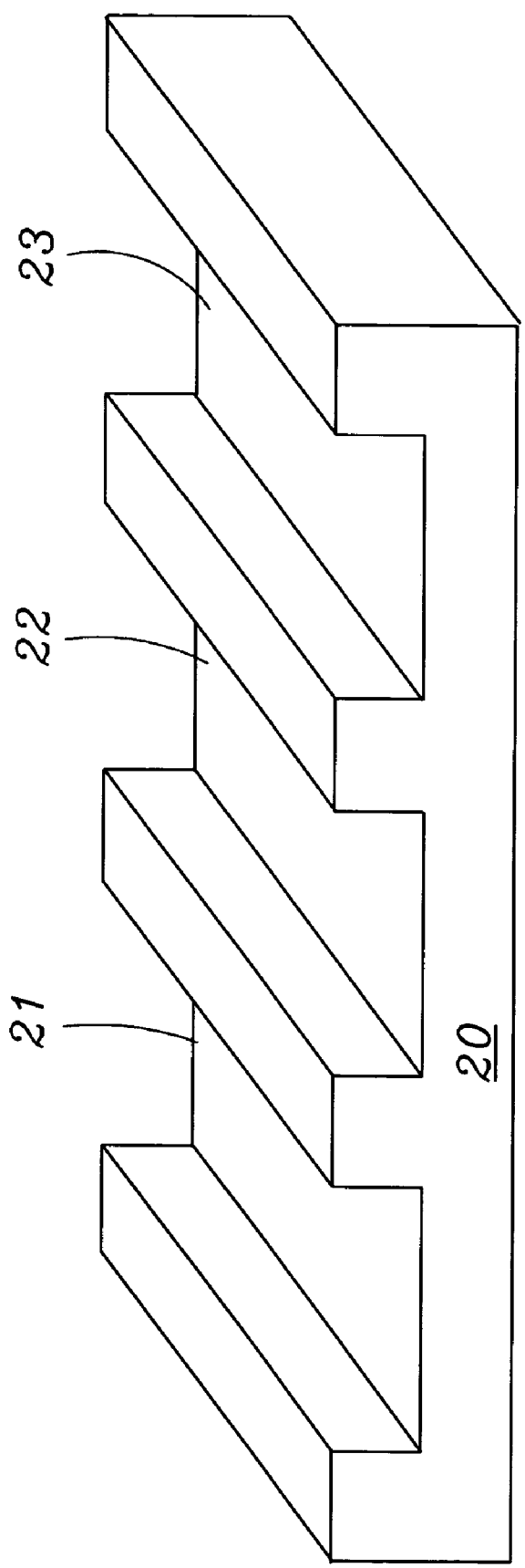
Figure 3:
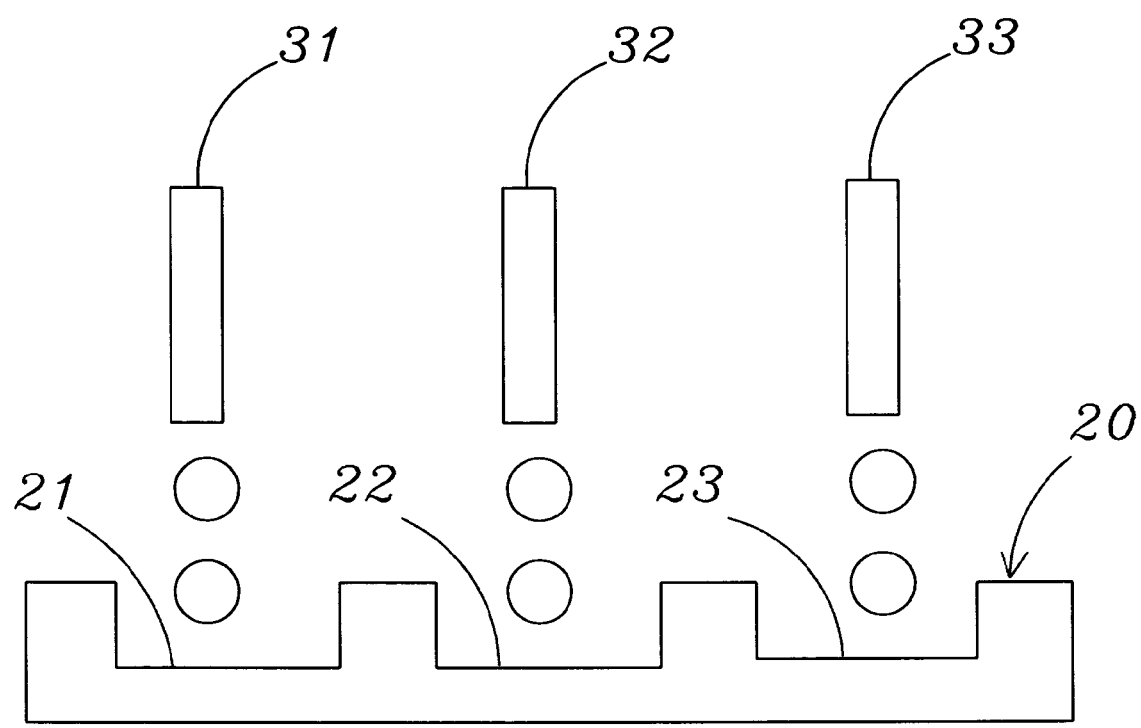
FIG. 3 is an example of the present invention showing the groove of the substrate where the color filtering layer is jetted.

The steps of the color filter manufacturing method for a plastic substrate according to the present invention can be described below. First, please referring to FIG. 2*a*, it uses three-bump areas 101, 102, and 103 of the master mold 10 to extrude a substrate 20. The substrate is with three corresponding grooves 21, 22 and 23 as shown in FIG. 2*b*. Then, the three grooves 21, 22 and 23 of the substrate are filled with three primary colors of R(31), G(32) and B(33) color filtering layers in order by using the inkjet printing method as shown in FIG. 3.

Figure 4:
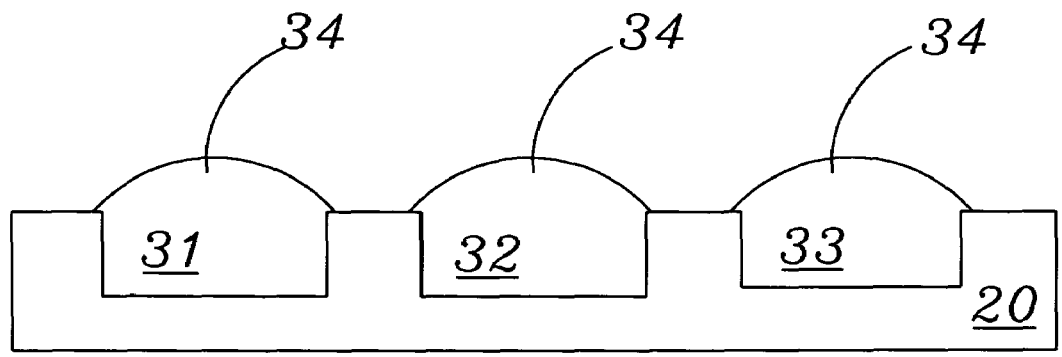
FIG. 4a is one of the preferred embodiments showing a plastic substrate filled with color filtering layers according to the present invention.
FIG. 4b is another preferred embodiment of the present invention showing a plastic substrate filled with color filtering layers.
Figure 4:
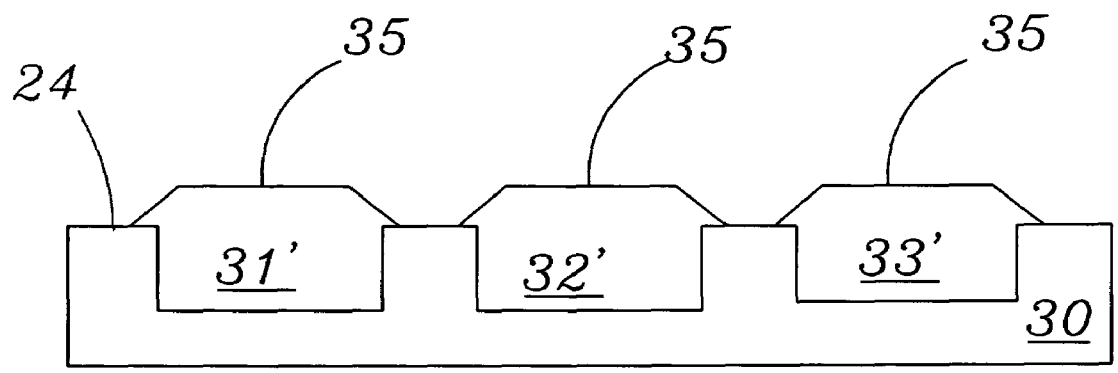

As shown in FIG. 4, the color filtering layers 31, 32 and 33 in the above saying groove bring the surface tension thereto form an arc surface 34 in the surface of the color filtering layer which is higher than the substrate 20. In order to overcome the problem, the side of the groove in the plastic substrate can be formed as a rough surface, for example, the surface with multiple pits. Therefore, it can decrease the protruding heights of the color filtering layers 31, 32, and 33 after molding. Then, the topside forms as a plane surface 35 as shown in FIG. 4*b*.

Figure 5:
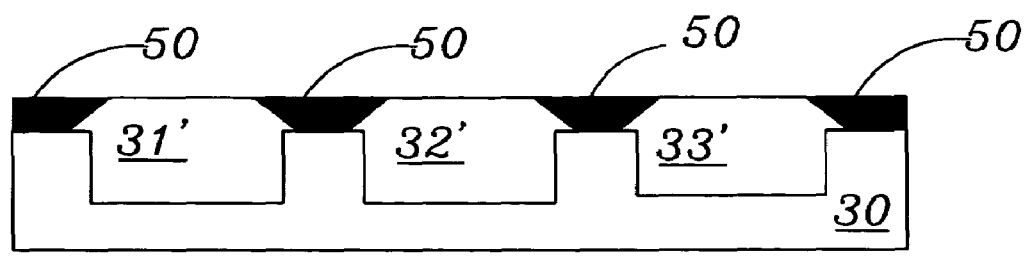
FIG. 5 is an example of the present invention showing the plastic substrate in FIG. 4b additionally filled with the black photo-resist.
Figure 6:
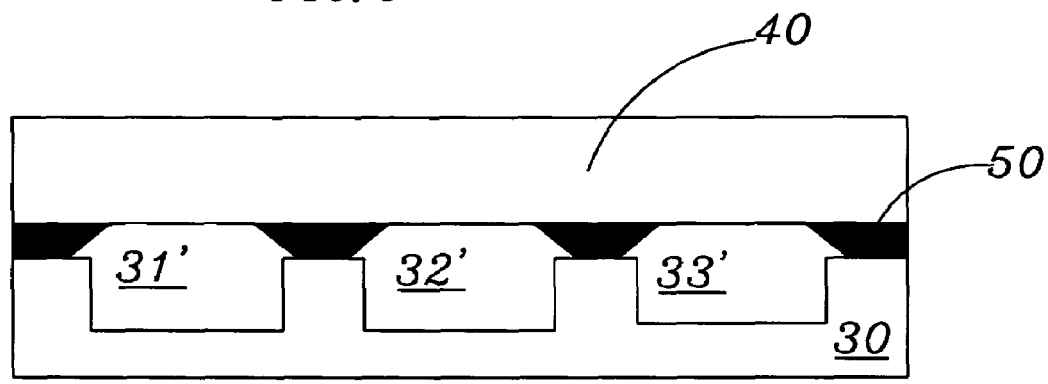
FIG. 6 is an example of the present invention showing a passivation layer formed on the surface of the plastic substrate referring to FIG. 5.

The consequent step of a color filter manufacturing method for a plastic substrate according to the present invention can be seen in FIG. 5. The black photo-resist 50 is similarly jetted into the gaps of the color filtering levers 31, 32 and 33 by using the inkjet printing method. Finally, the top of the above saying color filtering layers 31, 32 and 33 is covered with a passivation layer 40 as shown in FIG. 6 for implementing a so-called color filter manufacture of the present invention. The present invention can divide it as two types, which are the transparent type and the reflective type.

Figure 7:
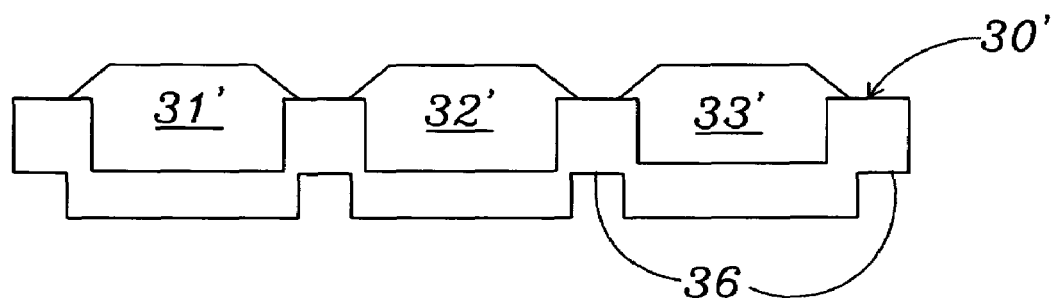
FIG. 7 is another preferred embodiment of the present invention showing the substrate having a groove set on the bottom of the substrate and filled with the black photo-resists.

According to the color filter manufacturing method for a plastic substrate as mentioned above for the present invention, the black photo-resist 50 is disposed on the same side of the protruding side in each color filtering layers 31, 32 or 33 as shown in FIG. 5 and FIG. 6. Another preferred embodiment of the present invention sets the black photo-resist on the opposite side of protruding side in above saying color filtering layers 31, 32, and 33. As can be seen in FIG. 7, the bottom of the substrate 30 forms multiple grooves 36. The multiple grooves 36 are placed on the bottom of the substrate 30 corresponding to the gaps of color filtering layers 31, 32 and 33. According to the molding method by using the above saying black photo-resist, the groove 36 is filled with the black photo-resist 51 from jetting. Further, the passivation layer 41 is filling on the gap of the color filtering layers 31, 32, and 33 in the top surface of the substrate 30 as shown in FIG. 8.

Figure 9:
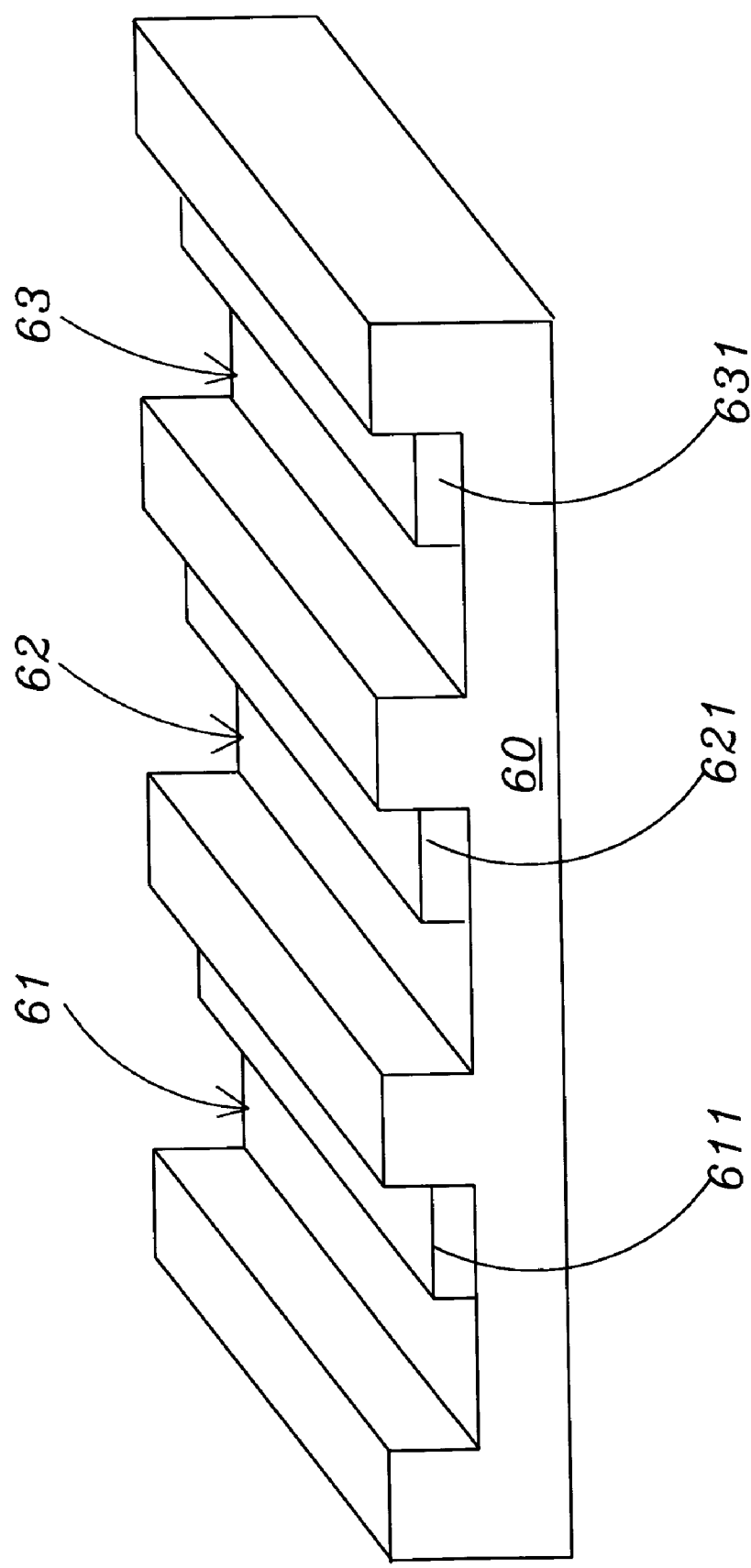
FIG. 9 is another 3-D graph showing the substrate according to the present invention.
Figure 10:
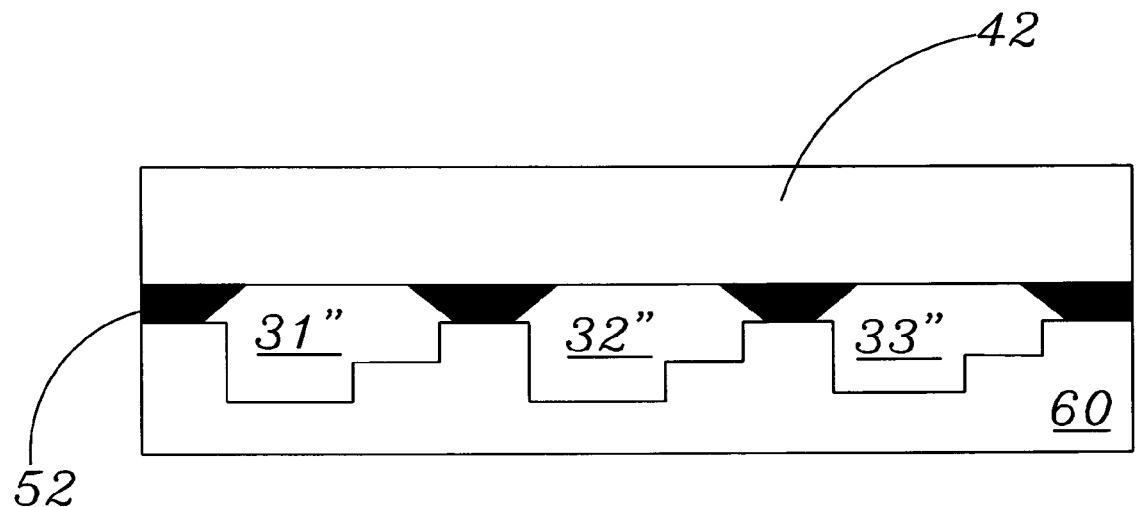
FIG. 10 is an example of the color filter based on FIG. 9, wherein the black photo-resist covers on the top surface of the substrate.
Figure 11:
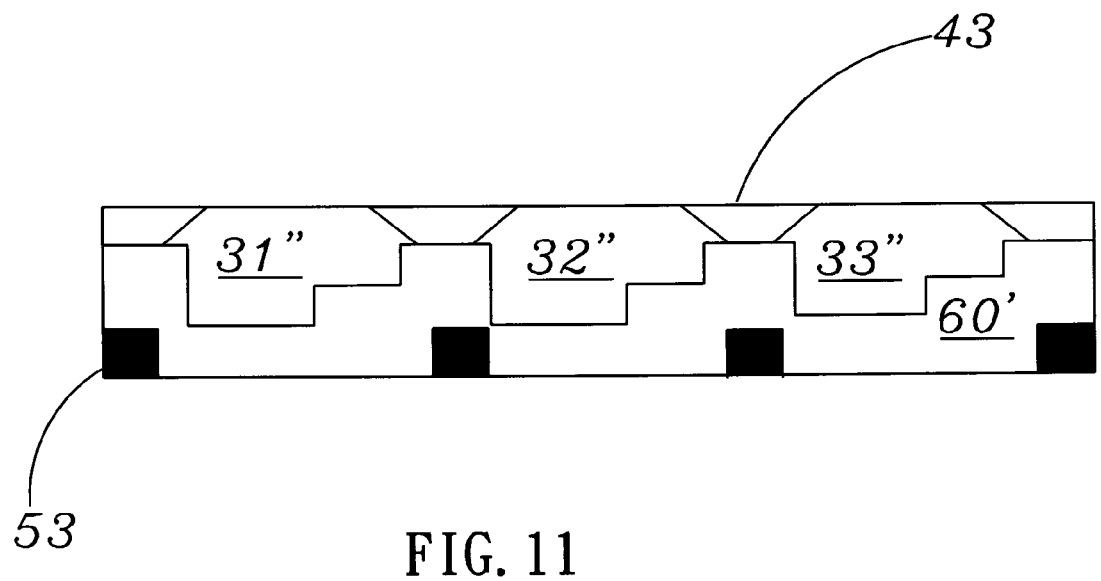
FIG. 11 is an example of the color filter based on FIG. 9, wherein the black photo-resist covers on the bottom surface of the substrate.

Apart from the application mentioned above for the present invention using in either a reflective or a transparent color filter, it also can apply to the transflective filter in the productions. A shown in FIG. 9, the master mold has been changed from its structure to extrude a plastic substrate 60 with different heights of the grooves. Each groove 61, 62, or 63 of the plastic substrate 60 has another bump 611, 621, or 631. Then, it repeats the above saying step of the photo-resist jetting according to the present invention. Each groove 62, 62, or 63 of the substrate 60 forms different color photo-resists 31", 32", and 33" and the black photo-resist 52 and the passivation layer 42 fill around as shown in FIG. 11. The bottoms of the above saying grooves 62, 62, and 63 form different ranges of heights. Therefore, while the light penetrating to each photo-resist 31", 32" or 33, different levels of reflective effects are occurred. Also, a transflective type color filter is formed. The transflective type color filter often uses on the mobile phone, the outdoor advertising display. The surrounding luminance is always changing but still needs to be required with a clear identify ability.

Figure 8:
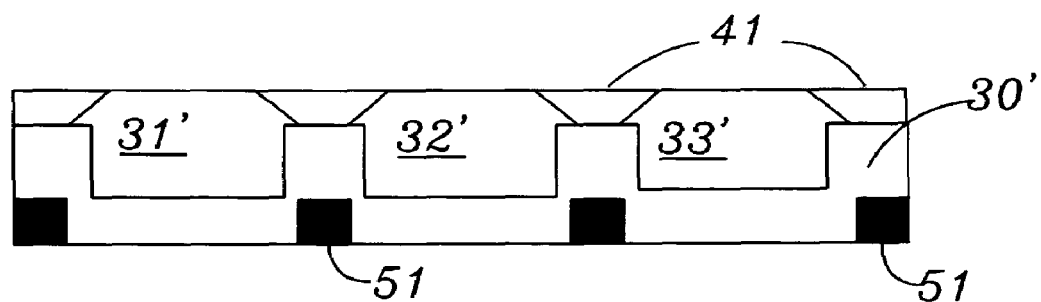
FIG. 8 is an example of the present invention showing the passivation layer covered on the substrate and the black photo-resist covered on the groove in FIG. 7.

Please referring to FIG. 11, the black photo-resist 53 is formed on the bottom of the substrate 60' based on the technique of FIG. 8 as shown in FIG. 12.

According to the above description, the present invention relates to a color filter manufacturing method for a plastic substrate, which wholly meets the improvement. Also, the present invention meets novelty, and therefore, is applicable to the industry.

Although the present invention has been described in detail with respect to alternate embodiments, various changes and modifications may be suggested to one skilled in the art, and it should be understood that various changes, suggestions, and alternations can be made hereto without departing from the spirit and scope of the invention as defined by the appended claims.

What is claimed is:

1. A color filter manufacturing method, comprising the steps of:
    providing a substrate with an extrusion method, the substrate having a plurality of grooves, each groove comprising an intermediary step portion between a top and bottom thereof;
    jetting a plurality of primary colors of red R, green G, blue B into the grooves of the substrate by inkjet printing method to form color filtering layers in the primary colors of R, G, B;
    jetting a black photo-resist liquid to the substrate by inkjet printing method and forming a black photo-resist thereon; and
    covering a plane passivation layer on the top surface of the substrate.

2. The color filter manufacturing method according to claim 1, wherein a surface area of the substrate around the groove is a smooth surface.

3. The color filter manufacturing method according to claim 1, wherein a surface area of the substrate around the groove is a rough surface.

4. The color filter manufacturing method according to claim 1, wherein the black photo-resist is formed on the surface of the substrate separated from the R, G, B color filtering layers.

5. The color filter manufacturing method according to claim 1, wherein the black photo-resist is formed in a plurality of pre-set grooves of the substrate, and the pre-set grooves are staggered to the R, G, B, color filtering layers.

6. The color filter manufacturing method according to claim 1, wherein the black photo-resist is jetted onto a surface of the substrate opposite to that on which the R, G, B color filtering layers are formed.

7. The color filter manufacturing method according to claim 6, wherein the black photo-resist is jetted into grooves formed in the substrate opposite to gaps between the R, G, B color filtering layers.

* * * * *